United States Patent [19]

Della Porta

[11] Patent Number: 4,766,653
[45] Date of Patent: Aug. 30, 1988

[54] METHOD AND TOOL FOR ASSEMBLING POWER SEMICONDUCTOR AND HEAT SINK

[75] Inventor: Joseph L. Della Porta, Southington, Conn.

[73] Assignee: Otis Elevator Company, Farmington, Conn.

[21] Appl. No.: 109,134

[22] Filed: Oct. 16, 1987

[51] Int. Cl.⁴ ............................................ A44B 21/00
[52] U.S. Cl. .................................... 24/563; 24/67.11; 24/573; 403/12
[58] Field of Search .................. 24/573, 574, 704, 543, 24/563, 523, 493, 67.9, 67.11; 403/12; 285/23

[56] References Cited

U.S. PATENT DOCUMENTS

| | | | |
|---|---|---|---|
| 1,283,037 | 10/1918 | Baltzley | 24/543 |
| 1,372,628 | 3/1921 | Mueller et al. | 285/23 |
| 1,675,286 | 6/1928 | Van Valkenburg | 24/563 |
| 1,817,424 | 8/1931 | Smiley | 24/67.11 |
| 2,007,431 | 7/1935 | Malcom | 24/573 |
| 2,012,422 | 8/1935 | Fanger | 24/67.11 |
| 3,348,272 | 10/1967 | Germani | 24/563 |

*Primary Examiner*—Victor N. Sakran
*Attorney, Agent, or Firm*—William W. Jones

[57] ABSTRACT

Transistors are sandwiched between two heat sinks which, in turn, are bolted together to form a transistor-heat sink assembly. The transistors are properly positioned between the heat sinks prior to the latter being bolted together by being clipped onto one of the heat sinks by spring clips. The spring clip has a concave end which embraces the transistor, which has a round configuration. Spring fingers flank the concave end of the clip and bear against a flange on the side of the transistor. The clip has a U-shaped portion distal of the concave end which slips over one of the fins on the heat sink, whereby the transistor is temporarily held in place on the heat sink. After assembly, the clips can be slipped off of the assembled combination without disturbing the latter.

2 Claims, 3 Drawing Sheets

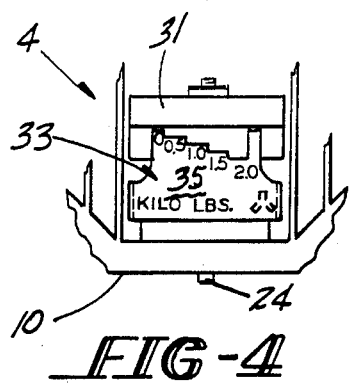
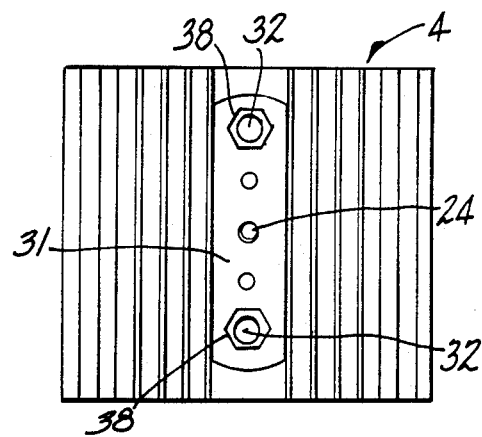
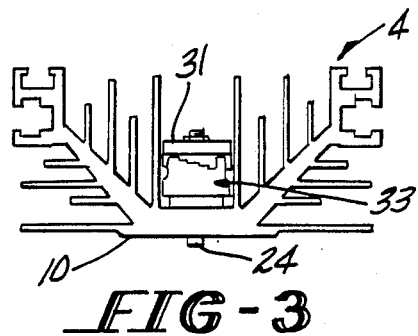
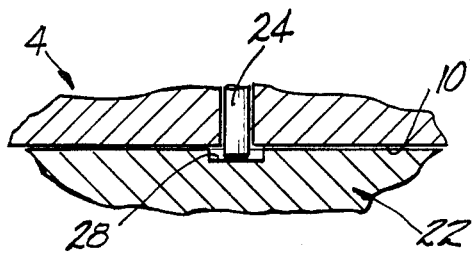
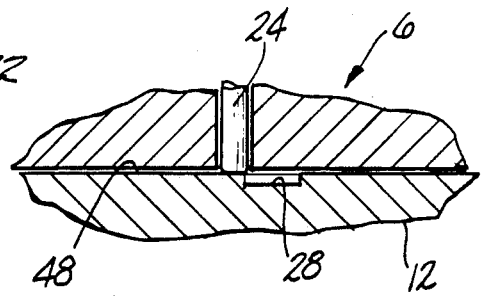

4,766,653

METHOD AND TOOL FOR ASSEMBLING POWER SEMICONDUCTOR AND HEAT SINK

DESCRIPTION

1. Technical Field

This invention relates to a method and tool for assembling a semiconductor-heat sink assembly in which the semiconductor or semiconductors are sandwiched between two heat sinks which are bolted together. More particularly, this invention relates to a procedure and tool for temporarily clipping the semiconductor or semiconductors onto one of the heat sinks before and while the two heat sinks are being joined together.

2. Background Art

An inverter assembly which is operable to convert direct current to alternating current to control the speed of a variable speed elevator motor comprises a pair of transistors, each of which is sandwiched between a pair of heat sinks. The heat sinks are clamped together by bolts, with the transistors being clamped in place between the heat sinks in heat transfer and electrical conducting contact with the heat sinks.

The heat sinks serve a dual purpose, one of which is to draw heat away from the transistor junction, and the other of which is to act as a current carrying conductor. For the heat sinks and transistors to perform properly, the transistors must be placed in the center of the heat sinks where a clamping force is used to hold the transistors and the heat sinks together. The clamp must apply a specified force to the transistors, which force is established by the transistor manufacturer to achieve a low thermal impedance and to minimize the contact resistance between the transistors and the heat sinks without physically damaging the transistors. When the transistor-heat sink combination is assembled initially, or when a failed transistor has to be replaced, it is difficult to hold the transistor in place, due to its size and the size and proximity of the two heat sinks. This creates the possibility that the transistor will not be centered or seated properly on the heat sinks. When this does occur, improper forces will be applied to the transistor and poor heat transfer will result, resulting in poor performance and substantially reduced operating life for the transistor.

The aforesaid description of a prior art assembly, while describing a transistor assembly, also applies to other types of semiconductor-heat sink assemblies which may involve rectifiers, thyristors, or other types of power semiconductors. These semiconductors are known as "hockey pucks" in the art, and are all disk-shaped, with external flanges.

3. Disclosure of the Invention

This invention eliminates the difficulty in properly positioning the transistor or other semiconductor device on the heat sink, and properly holding the transistor in place between the two heat sinks during the clamping operation. This invention contemplates the use of a specialty spring clip which can clip onto the heat sink body and at the same time engage the transistor and urge it against the heat sink so that it will be snugly held in place during the assembly operation. Once the assembly operation is completed, the clip is simply pulled away from the transistor and off of the heat sink. The result is that the transistors are accurately positioned on the heat sinks, and the proper clamping forces can be applied to the transistors to provide the finished assembly with a longer operational life.

It is therefore an object of this invention to provide an improved method for assembling an inverter assembly which converts direct current to alternating current and which includes one or more transistors sandwiched between heat sink and conductor bodies.

It is a further object of this invention to provide a method of the character described wherein the transistors are properly positioned and held in place in a relatively inaccessible location between the heat sink bodies while the latter are clamped together.

It is another object of this invention to provide a method of the character described wherein a spring clip is used to hold the transistors in place during the clamping operation.

It is an additional object of this invention to provide a method of the character described wherein the spring clip can be slid out of engagement with the assembly after the latter has been completed.

These and other objects and advantages of the invention will become more readily apparent from the following detailed description of a preferred embodiment thereof when taken in conjunction with the accompanying drawings.

BRIEF DESCRIPTION OF THE DRAWINGS

FIG. 2 is a plan view of one of the small heat sinks of the assembly showing the clamping leaf spring used to clamp the small heat sinks to the large heat sink;

FIG. 3 is a side elevational view of the heat sink of FIG. 2;

FIG. 4 is a fragmented and enlarged view similar to FIG. 3 but showing details of an integral force measuring gauge mounted on the heat sink for indicating the clamping force exerted on the semiconductor;

FIG. 9 is a fragmented sectional view of the joint between the semiconductor and heat sink and illustrating a good joint condition; and FIG. 10 is a view similar to FIG. 9 but showing a poor mounting of the semiconductor and the heat sink.

BEST MODE FOR CARRYING OUT THE INVENTION

Figure 1:
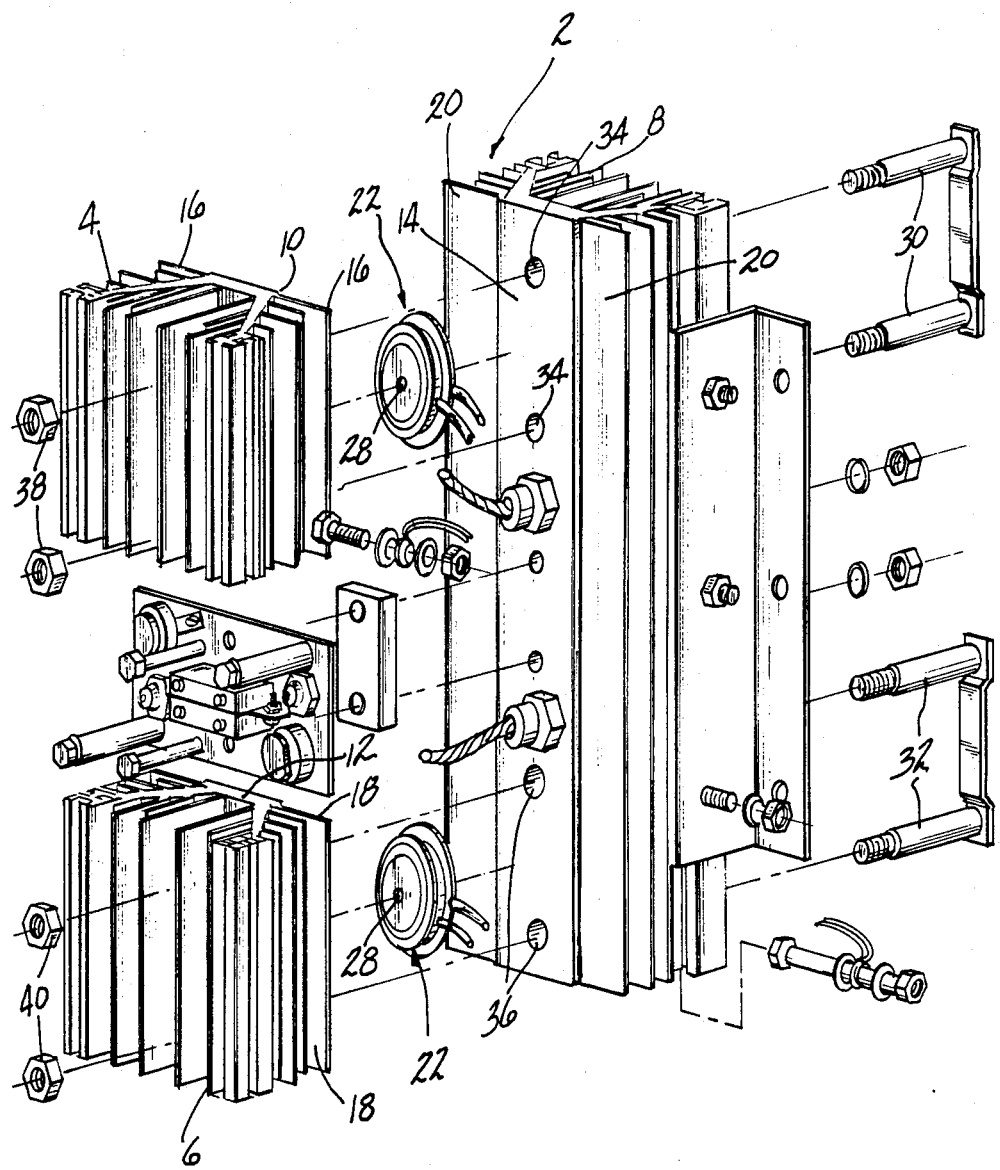
FIG. 1 is an exploded perspective view of an inverter assembly formed in accordance with this invention.
Figure 7:
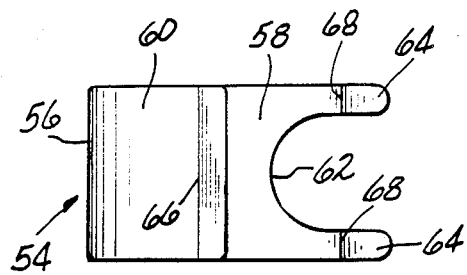
FIG. 7 is a top plan view of the spring clip of FIG. 3.
Figure 8:
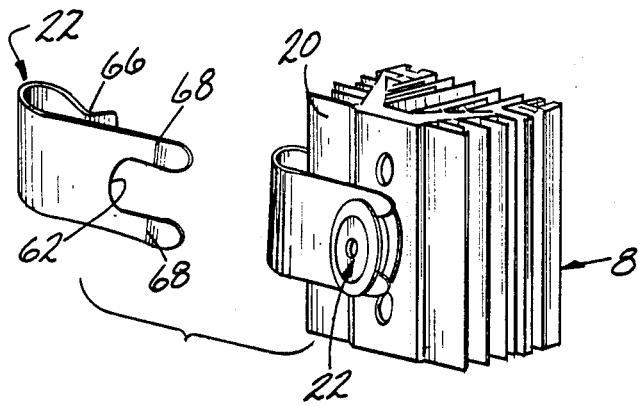
FIG. 8 is a perspective view showing how the spring clip holds the transistor in place on one of the heat sink bodies.

Referring now to the drawings there is shown in FIG. 1 one of the inverter assemblies, denoted generally by the numeral 2, which is formed in accordance with this invention. The inverter assembly 2 includes a pair of small heat sink bodies 4 and 6 which are connected to a larger heat sink body 8. It will be noted that the heat sink bodies 4, 6 and 8 all have heat dissipating fins formed thereon. The heat sinks 4 and 6 both have faces 10 and 12 which oppose a face 14 on the larger heat sink 8. The face 10 is flanked by fins 16, the face 12 is flanked by fins 18, and the face 14 is flanked by fins 20. A pair of transistors 22 are sandwiched between the heat sinks 4, 8 and 6, 8. The transistors 22 are mounted on pins 24 which are set in bores in the heat sinks 4 and 6 and protrude slightly from the faces 10 and 12, as shown in FIGS. 7 and 8. The pins 24 are received in recesses 28 in the transistors 22 and serve to properly center the transistors 22 with respect to the heat sinks 4, 6 and 8. The heat sinks 4 and 6 are clamped to the heat sink 8 by means of bolts 30 and 32 which extend through passages 34 and 36 respectively in the heat sink 8, as well as through corresponding passages (not shown) in the heat sinks 4 and 6. The bolts 30 and 32 are tightened in place by nuts 38 and 40 respectively.

As seen in FIGS. 2-4, the bolts 32 extend through a leaf spring blade 31 which is part of a force-measuring gauge 33 mounted on the heat sinks 4 and 6. When the nuts 38 and 40 are tightened onto the bolts 30 and 32, the leaf spring 31 is deflected downwardly toward the heat sinks 4 and 6. The gauge 33 includes a scale 35 in the form of a stepped plate which has clamping force indicia printed thereon. Using the underneath surface of the leaf spring 31 as a reference, one can see how tightly the transistor is being clamped between the heat sinks. The gauge is mounted on the heat sinks 4 and 5 by the same pins 24 which are used to center the transistors.

Figure 5:
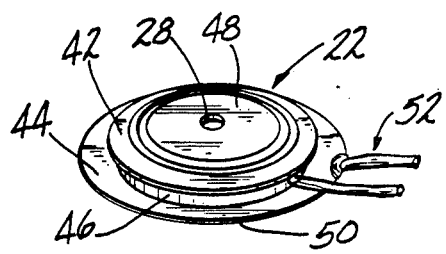
FIG. 5 is a perspective view of one of the transistors used in the assembly of FIG. 1.

FIG. 5 shows some details of the transistor 22. The transistor 22 is generally cylindrical in shape and includes first and second radial flanges 42 and 44 bounding a medial circumferential groove 46. The recesses 28 are positioned in each end wall 48 and 50 of the transistor 22. Electrical wires 52 extend from the transistor 22. As previously noted, the device 22 can be any power semiconductor so long as it is found with the flange or flanges 42, 44.

Figure 6:
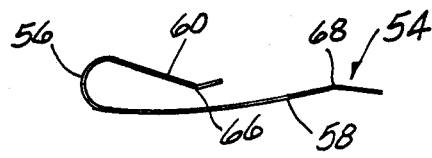
FIG. 6 is a side elevational view of the spring clip used to position and hold the transistors in place in one of the heat sinks during assembling of the inverter of FIG. 1.

FIGS. 6 and 7 show the spring clip, denoted generally by the numeral 54, which is used to temporarily secure the transistors 22 to one of the heat sinks 4, 6 or 8, while the inverter 2 is being assembled. The spring clip 54 is formed from flat stock sheet steel which is cut and bent to the proper configuration shown in the drawings. The spring clip 54 is one piece and includes a radiused spring end 56 which is the primary source of the clamping force used to hold the transistor 22 in place on the heat sinks. Flanking the radiused end 56 are two clamping arms 58 and 60, the arm 58 projecting further away from the radiused end 56 than the arm 60. On the distal end of the arm 58 there is formed a concave recess 62 bonded by smoothly radiused fingers 64. The spring clip 54 has two linear bends, one of which, 66, is adjacent to the distal end of the spring arm 60, and the other, 68, of which is adjacent the ends of the fingers 64. It will be seen from FIG. 3 that these bends 66 and 68 are formed by bending the sheet in opposite directions in each case. The bends 66 and 68 thus provide zones of line contact between the spring clip 54 and whatever it is slipped over. The recess is sized to snugly embrace the medial groove 46 on the transistor 22, as is shown in FIG. 5.

To secure the transistor 22 on the heat sink 8, the mounting pin 24 is inserted into the recess 28 on the appropriate face of the transistor 22. The spring clip 54 is then slipped over the fin 20 and the recess 62 is brought into abutment with the transistor groove 46. The bends 68 are thus stressed against the flange 42 on 44 on the transistor 22 while the bend 66 is stressed against the opposite side of the fin 20, as shown in FIG. 8. The transistor 22 is thus firmly pressed against the heat sink 8 by the spring clip 54. The other heat sinks 4 and 6 are then properly aligned with the heat sink 8, and the bolts 30 and 32 are used to secure the assembly together. When the assembly is completed, the spring clips 54 can simply be pulled off of the heat sink fins 20, free of the assembly. The transistors 22 will remain in place between the heat sinks, and will be properly positioned and clamped in place.

Referring to FIGS. 9 and 10, the nature of the joint between the transistor 22 and the surface 10 or 12 on the small heat sinks 4 or 6 is shown. It will be noted that in FIG. 9 the pin 24 is properly positioned in the transistor recess 28. As a result there is full surface-to-surface contact between the transistor 22 and the heat sink 4, and heat is conducted efficiently away from the transistor 22. This positioning is ensured when the clip of this invention is used. In contrast, FIG. 10 shows a condition wherein the pin 24 has not remained in the transistor recess 28, and instead abuts the flat surface 48 of the transistor 22. This causes the transistor 22 to be skewed against the heat sink 6 and prevents full surface-to-surface contact between the surfaces 48 and 12. As a result heat transfer is inefficient, and will be retarded where there is an air gap between the surfaces 48 and 12. The transistor 22 will typically overheat and burn out prematurely. This condition will frequently occur when the clip of this invention is not used to hold the transistor 22 in position.

It will be readily appreciated that the method and tool of this invention will ensure that the transistors are properly positioned and held in place in the inverter assembly. The tool is quite simple and inexpensive to make and greatly increases the operating life of the more expensive inverter assembly.

Since many changes and variations of the disclosed embodiment of the invention may be made without departing from the inventive concept, it is not intended to limit the invention other than as required by the appended claims.

I claim:

1. A spring clip for temporarily securing a power semiconductor member to a heat sink body having a plurality of heat dissipating fins, said clip comprising: a flat sheet of springy material which includes a first radiused spring end portion flanked by first and second clamping arms, one of said clamping arms having a first terminal edge proximate said spring end portion of the clip, and the other of said clamping arms having a concave terminal edge distal of said spring end portion and extending beyond said first terminal edge, said concave terminal edge of said other clamping arms forming a concavity for contacting a side wall of the semiconductor member in a non-gripping manner, and including a pair of smoothly radiused fingers flanking the concavity, each of said fingers being formed with a first linear bend which provides engagement with a radial flange extending perpendicular to the semiconductor member side wall, and said first and second clamping arms forming clamping means which can be slid over one of the heat dissipating fins on the heat sink body to fix the clip to the heat sink body and bias the semiconductor member against the heat sink body.

2. The spring clip of claim 1 wherein said one clamping arm is formed with a transverse linear bend which is closely adjacent to first terminal edge, parallel to said first linear bends, and which engages the surface of the one of the heat dissipating fins when the clip is mounted on the heat sink body.

* * * * *